(12) United States Patent
Bharathraj et al.

(10) Patent No.: US 12,352,817 B2
(45) Date of Patent: Jul. 8, 2025

(54) ELECTRONIC DEVICE AND METHOD WITH BATTERY STATE DETECTION

(71) Applicant: SAMSUNG ELECTRONICS CO., LTD., Suwon-si (KR)

(72) Inventors: Sagar Bharathraj, Bengaluru (IN); Shashishekara Parampalli Adiga, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 201 days.

(21) Appl. No.: 18/344,222

(22) Filed: Jun. 29, 2023

(65) Prior Publication Data

US 2024/0044991 A1    Feb. 8, 2024

(30) Foreign Application Priority Data

Aug. 8, 2022   (IN) .............................. 202241045301
Mar. 24, 2023   (KR) ........................ 10-2023-0038494

(51) Int. Cl.
  *G01R 31/389*   (2019.01)
  *G01R 31/36*   (2020.01)
  *G01R 31/367*   (2019.01)
  *G01R 31/392*   (2019.01)

(52) U.S. Cl.
  CPC ....... *G01R 31/389* (2019.01); *G01R 31/3648* (2013.01); *G01R 31/367* (2019.01); *G01R 31/392* (2019.01)

(58) Field of Classification Search
  None
  See application file for complete search history.

(56) References Cited

U.S. PATENT DOCUMENTS

| 2010/0188054 A1 | 7/2010 | Asakura et al. |
| 2020/0200834 A1 | 6/2020 | Uchino et al. |
| 2021/0103001 A1* | 4/2021 | Seo ....................... G01R 31/392 |

FOREIGN PATENT DOCUMENTS

| CN | 110780225 A | 2/2020 |
| CN | 111845353 A | 10/2020 |
| JP | 2013-254586 A | 12/2013 |
| JP | 2021-105557 A | 7/2021 |
| KR | 10-2020-0102923 A | 9/2020 |

* cited by examiner

*Primary Examiner* — Jas A Sanghera
(74) *Attorney, Agent, or Firm* — NSIP Law (57) ABSTRACT

A method and electronic device with battery state detection are provided. The method includes generating relative cumulative cell resistance (RCCR) curve information of a target battery based on constant voltage (CV) phase data of the target battery recorded during a charging operation of the target battery; and generating at least one of aging or shorting condition information of the target battery based on the generated RCCR curve information.

21 Claims, 7 Drawing Sheets

ELECTRONIC DEVICE AND METHOD WITH BATTERY STATE DETECTION

CROSS-REFERENCE TO RELATED APPLICATIONS

This application claims the benefit under 35 USC § 119(a) of Indian Patent Application No. 202241045301 filed on Aug. 8, 2022, in the Indian Patent Office, and Korean Patent Application No. 10-2023-0038494 filed on Mar. 24, 2023, in the Korean Intellectual Property Office, the entire disclosures of which are incorporated herein by reference for all purposes.

BACKGROUND

1. Field

The following description relates to an electronic device and method with battery state detection.

2. Description of Related Art

In assessing the safety and health of batteries, a typical approach is to detect short circuits and aging in batteries, especially in their early stages, thereby estimating the state of short/(SOS) and the state of health (SOH)

SUMMARY

This Summary is provided to introduce a selection of concepts in a simplified format that are further described below in the Detailed Description. This Summary is not intended to identify key features or essential features of the claimed subject matter, nor is it intended to be used as an aid in determining the scope of the claimed subject matter.

In one general aspect, a processor-implemented method of an electronic device includes generating relative cumulative cell resistance (RCCR) curve information of a target battery based on constant voltage (CV) phase data of the target battery recorded during a charging operation of the target battery; and generating at least one of aging or shorting condition information of the target battery based on the generated RCCR curve information.

The generating of the RCCR curve information may include generating a cumulative cell resistance (CCR) value by calculating a plurality of cell resistance (CR) values of the target battery based on the recorded CV phase data and summing the plurality of CR values over a determined period of time; and calculating an RCCR value, of the RCCR curve information, based on a threshold CCR value representing a heathy battery and the CCR value of the target battery.

The generating of the at least one of the aging or shorting condition information may include detecting that the target battery is in at least one of an aging or shorting condition based on a determination of whether an RCCR value of the RCCR curve information of the target battery is greater than a threshold RCCR value corresponding to a healthy battery.

The generating of the at least one of the aging or shorting condition information may include detecting that the target battery is in an aging condition based on a determination that the RCCR curve information has an exponential rise, in which the RCCR curve information rises, on a corresponding RCCR curve, exponentially from an origin to a particular point.

The method may further include estimating a state of health (SOH) of the target battery based on a point on the RCCR curve at which a slope of the RCCR curve starts to remain constant, based on the aging condition of the target battery being detected.

The estimating of the SOH of the target battery may include estimating the SOH based on a RCCR value at the point on the RCCR curve at which the slope of the RCCR curve starts to remain constant.

The generating of the at least one of the aging or shorting condition information may include detecting that the target battery is in the shorting condition based on a determination that an RCCR value of the RCCR curve information is negative for a predetermined duration.

The method may further include estimating a state of short (SOS) of the target battery based on a long-term slope value of a RCCR curve of the RCCR curve information, based on the shorting condition of the target battery being detected.

The generating of the at least one of the aging or the shorting condition information may include detecting whether the target battery is shorted, including determining that the target battery is not shorted in response to a long-term slope value of a RCCR curve, of the RCCR curve information, being estimated to be zero.

The generating of the at least one of the aging or the shorting condition information may include detecting whether the target battery is aged, including determining that the target battery is unaged based on all RCCR values of the RCCR curve information being greater than or equal to zero.

In another general aspect, an electronic device includes a processor configured to generate relative cumulative cell resistance (RCCR) curve information of a target battery based on constant voltage (CV) phase data of the target battery recorded during a charging operation of the target battery; and generating at least one of aging or shorting condition information of the target battery based on the generated RCCR curve information.

The processor may be further configured to generate a cumulative cell resistance (CCR) value by calculating a plurality of cell resistance (CR) values of the target battery based on the recorded CV phase data and summing the plurality of CR values over a determined period of time; and calculate an RCCR value, of the RCCR curve information, based on a threshold CCR value representing a healthy battery and the summed CCR value of the target battery.

The processor may be further configured to detect that the target battery is in at least one of an aging or shorting condition based on a determination of whether an RCCR value of the RCCR curve information of the target battery is greater than a threshold RCCR value corresponding to a healthy battery.

The processor may be further configured to detect that the target battery is in an aging condition based on a determination that the RCCR curve information has an exponential rise, in which the RCCR curve information rise, on a corresponding RCCR curve, exponentially from an origin to a particular point.

The processor may be further configured to estimate a state of health (SOH) of the target battery based on a point on the RCCR curve at which a slope of the RCCR curve starts to remain constant, based on the aging condition of the target battery being detected.

The processor may be further configured to estimate the SOH based on a RCCR value at the point on the RCCR curve at which the slope of the RCCR curve starts to remain constant.

The processor may be further configured to detect that the target battery is in the shorting condition based on a determination that an RCCR value of the RCCR curve information is negative for a predetermined duration.

The processor may be further configured to estimate a state of short (SOS) of the target battery based on a long-term slope value of a RCCR curve of the RCCR curve information, based on the shorting condition of the target battery being detected.

The processor may be further configured to determine that the target battery is not shorted in response to a long-term slope value of a RCCR curve, of the RCCR curve information, being estimated to be zero.

The processor may be further configured to determine that the target battery is unaged based on all RCCR values of the RCCR curve information being greater than or equal to zero.

The processor is further configured to output the generated at least one of the aging or shorting condition information for controlling operation of the electronic device.

Other features and aspects will be apparent from the following detailed description, the drawings, and the claims.

Throughout the drawings and the detailed description, unless otherwise described or provided, it may be understood that the same drawing reference numerals refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

As used herein, the term "and/or" includes any one and any combination of any two or more of the associated listed items. The phrases "at least one of A, B, and C", "at least one of A, B, or C", and the like are intended to have disjunctive meanings, and these phrases "at least one of A, B, and C", "at least one of A, B, or C", and the like also include examples where there may be one or more of each of A, B, and/or C (e.g., any combination of one or more of each of A, B, and C), unless the corresponding description and embodiment necessitates such listings (e.g., "at least one of A, B, and C") to be interpreted to have a conjunctive meaning.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing. It is to be understood that if a component (e.g., a first component) is referred to, with or without the term "operatively" or "communicatively," as "coupled with," "coupled to," "connected with," or "connected to" another component (e.g., a second component), it means that the component may be coupled with the other component directly (e.g., by wire), wirelessly, or via a third component.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein.

There are existing solutions for detecting the safety and health of batteries. However, the existing devices and methods for detecting short circuits and aging in batteries use complicated probes that require a huge amount of data and/or modification of charging protocols. Therefore, it is found herein to be beneficial to use at least an alternate device and method that may overcome the above deficiencies and help optimize the detection of the safety and health of batteries.

According to one or more embodiments described herein, example electronic devices and methods with health and safety detection for a target battery may be provided. As a non-limiting example, an example method may include recording constant voltage (CV) phase data of a target battery during a charging operation. During the charging operation, the CV phase data may be recorded for a predetermined time period. For example, the CV phase data may be recorded for 15 minutes to estimate a state of short and state of health (SOS-SOH) within 1 millisecond (ms). The method may further include calculating a relative cumulative cell resistance (RCCR) value of the target battery based on the recorded CV phase data. The method may further include analyzing the calculated RCCR value of the target battery based on a threshold RCCR value representing a healthy battery with respect to a determined time point. The method may further include generating one or more RCCR curves of the target battery based on the analyzed RCCR value. The method may further include detecting at least one of aging and shorting conditions of the target battery based on the calculated RCCR value and the generated plurality of RCCR curves. An example electronic device may be configured to perform any or all of example methods described herein, and output the detected battery state.

Figure 1:
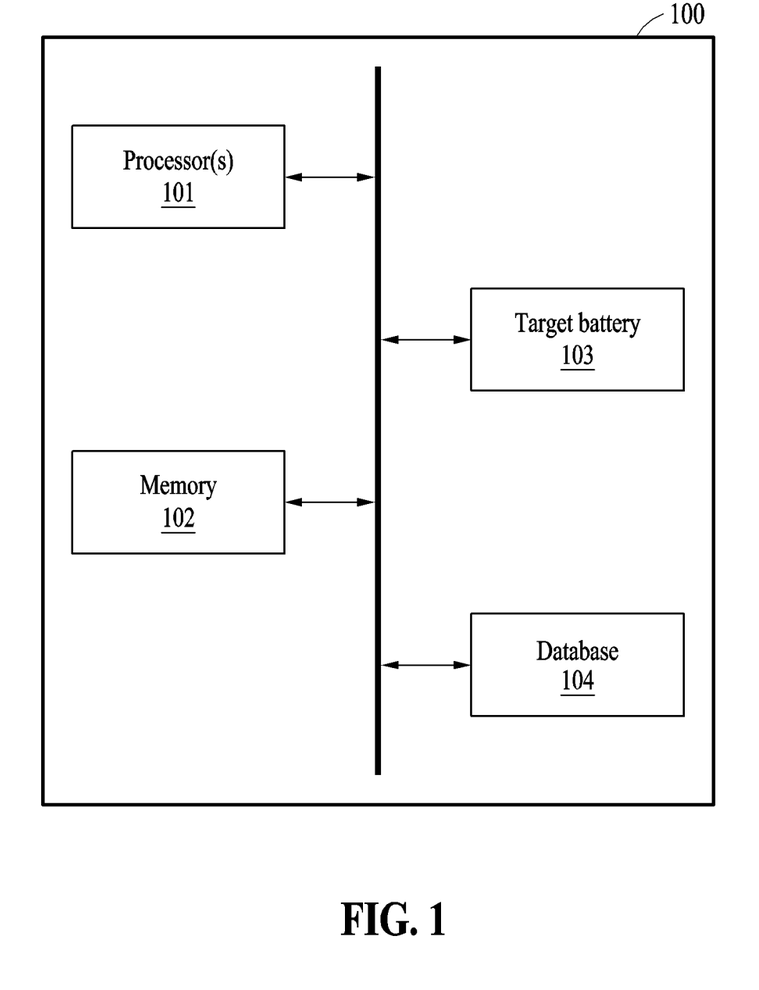
FIG. 1 illustrates an example electronic device with battery state detection according to one or more embodiments.

FIG. 1 illustrates an example electronic device with battery state detection according to one or more embodiments. Referring to FIG. 1, an example electronic device 100 may include at least one processor 101 connected to a memory 102, the target battery 103 of which health and safety may be detected and determined, and a database 104.

In an example, the processor 101 may be a single processor or a number of processors, all of which may include, or be included in, multiple computing devices. The processor 101 may be one or more microprocessors, microcomputers, microcontrollers, digital signal processors, central processing units, logical processors, virtual processors, state machines, logic circuitries, and/or any devices that are configured to manipulate signals based on operational instructions, all as non-limiting examples. Among other capabilities, the processor 101 may be configured to fetch and execute computer-readable instructions and data stored in the memory 102 and/or the database 104.

In an example, the memory 102 may include any non-transitory computer-readable medium known in the art including, but are not limited to, volatile memory, such as static random-access memory (SRAM), dynamic RAM (DRAM) and the like, and/or non-volatile memory, such as read-only memory (ROM), erasable programmable ROM (EPROM), flash memories, hard disks, optical disks, magnetic tapes and the like, as non-limiting examples.

In an example, the database 104 may be, or implemented with, integrated hardware or hardware in combination with computer-readable instructions, such as a software system running on general-purpose hardware or a hardware disk controller with programmable search capabilities as non-limiting examples. Examples of the database 104 may include, but are not limited to, an in-memory database, a cloud database, a distributed database, an embedded database and the like. The database 104, amongst other things, may serve as a repository for storing data that may be processed, received, and generated by the processor 101, and one or more of additional processors of the electronic device 100.

According to one or more embodiments, the processor 101 of the electronic device 100 may be configured, e.g., by execution of the instructions and/or data in the memory 102 and the database 104, to perform any one or any combination of the operations or methods described herein. In a non-limiting example, the processor 101 may be configured to record CV phase data of the target battery 103 during a charging operation. The processor 101 may be further configured to calculate RCCR values of the target battery 103 based on the recorded CV phase data. The processor 101 may be further configured to analyze each of the RCCR values of the target battery 103 based on a threshold RCCR value representing a healthy battery with respect to a determined time point. The processor 101 may be further configured to generate a plurality of RCCR curves of the target battery 103 based on the analyzed RCCR values. The processor 101 may be further configured to detect at least one of aging and shorting conditions of the target battery 103 based on the calculated RCCR values and the generated plurality of RCCR curves.

Figure 2A:
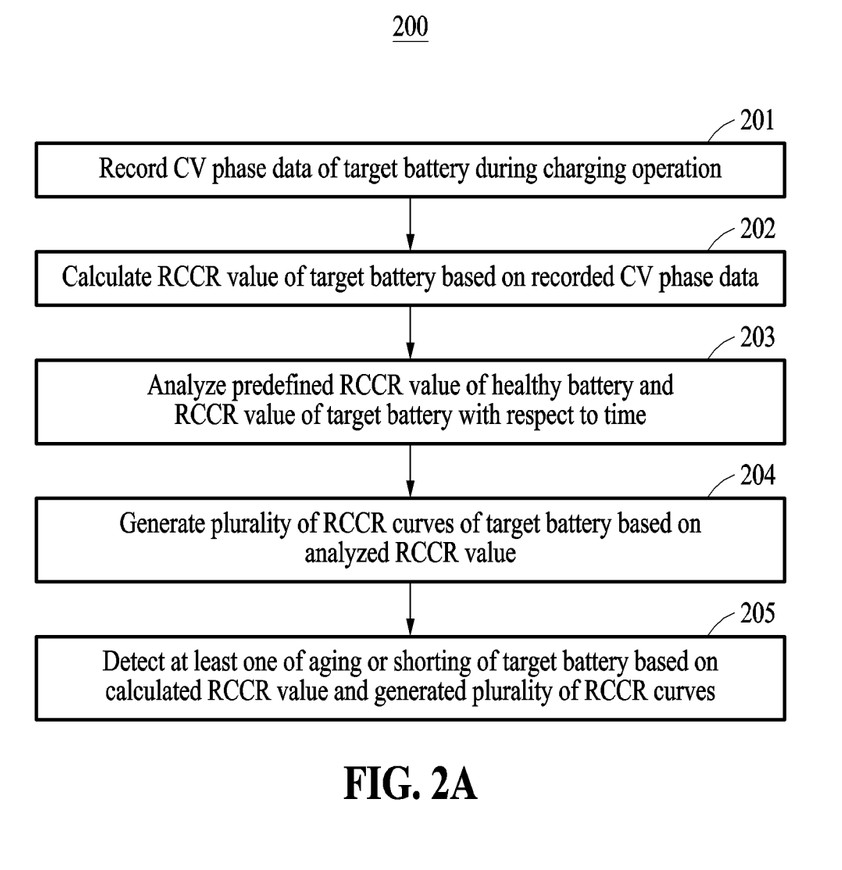
FIG. 2A illustrates an example method with battery state detection according to one or more embodiments.

FIG. 2A illustrates an example method 200 of detecting health and/or safety of a target battery according to one or more embodiments. The example method 200 may be implemented in an electronic device (e.g., the electronic device 100 in FIG. 1). In an example, the method 200 may be performed using the at least one processor (e.g., the processor 101 in FIG. 1). Referring to FIG. 2A, the example method may include operations 201 through 205, which may be performed in the shown order and manner. However, the order of some operations may be changed, some of the operations may be omitted, or any additional operation may be added, without departing from the spirit and scope of the shown example. At least some of the operations of FIG. 2A may be performed in parallel, simultaneously, or any suitable order that may optimize the battery detecting method described herein.

In operation 201, the method 200 may include recording CV phase data of a target battery (e.g., the target battery 103 in FIG. 1) during a charging operation for a predetermined time period. For example, the predetermined time period for recording the CV phase data of the target battery for a same condition (e.g., Vcut-off and ambient temperature) during the charging condition may be considered 15 minutes.

In operation 202, the method 200 may perform calculating a respective one of RCCR values of the target battery based on the recorded CV phase data.

The respective one of the RCCR values of the target battery (also referred to as "target cell") may be calculated using Equation 1.

$$RCCR = 1 - \frac{\sum_{t=0}^{t=t}\left(\frac{V}{I}\right)\text{target cell}}{\sum_{t=0}^{t=t}\left(\frac{V}{I}\right)\text{healthy cell}}; \text{for all } t \qquad \text{Equation 1}$$

Where t may denote a time, V may denote a voltage, and I may denote a current.

In an example, the method 200 may perform calculating a cumulative cell resistance (CCR) value of the target battery (also referred to as "target cell") based on the recorded CV phase data over a determined period of time. The method may generate a CRR value of the target battery by summing the plurality of CR values (V/I) over the determined period of time. The method 200 may further perform comparing the CCR value of the target battery with a threshold CCR value (V/I) representing a healthy battery (also referred to as "healthy cell"). The threshold CCR value of the healthy battery may be stored in a database of an electronic device (e.g., the database 104 of the electronic device 100 in FIG. 1).

In operation 203, the method 200 may perform analyzing the calculated RCCR value of the target battery based on a threshold RCCR value representing a healthy battery with respect to a determined time point. The analyzed data may be used to respectively detect and output whether the target battery is in a healthy condition or is at least one of aging and shorting conditions.

In an example, when the RCCR value of the target battery is determined with an indication of being greater than the threshold RCCR value, it is detected that the target battery is at least one of aging and shorting conditions based on the indication.

In operation 204, the method 200 may perform generating one or more RCCR curves of the target battery 103 based on the analyzed RCCR value. The one or more RCCR curves of the target battery 103 may be plotted on a graph (e.g., a graph in FIG. 3) that demonstrates a relationship of RCCR vs. time.

In operation 205, the method 200 may perform detecting at least one of aging and shorting conditions of the target battery based on the respective calculated RCCR values and the generated plurality of RCCR curves. When either aging or shorting condition or both conditions are detected, the method 200 may further perform estimating aging or shorting condition or both conditions. During the estimation, the method may determine and output by how much percentage the target battery is shorted or by how much percentage the battery is aged or by how much percentage the battery is both shorted and aged. The estimation may be analyzed from the one or more RCCR curves with respect to a predetermined healthy battery curve plotted on the RCCR vs. time graph (e.g., the graph of FIG. 3).

Figure 2B:
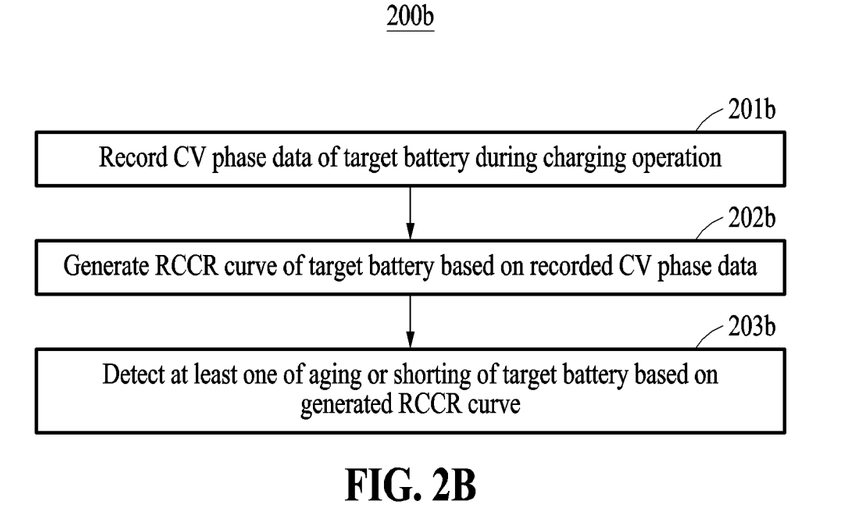
FIG. 2B illustrates an example method with battery state detection according to one or more embodiments.

FIG. 2B illustrates an example method 200b of detecting health and/or safety of a target battery according to one or more embodiments. The method 200b may be performed by an electronic device (e.g., the electronic device 100 of FIG. 1). In an implementation, the method 200b may be performed by at least one processor (e.g., the processor 101 of FIG. 1). Referring to FIG. 2B, the example method may include operations 201b through 203b, which may be performed in the shown order and manner. However, the order of some operations may be changed, some of the operations may be omitted, or any additional operation may be added, without departing from the spirit and scope of the shown example. At least some of the operations of FIG. 2B may be performed in parallel, simultaneously, or any suitable order that may optimize the battery detecting method described herein.

In operation 201b, the at least one processor may record CV phase data of a target battery (e.g., the target battery 103 in FIG. 3) during a charging operation.

In operation 202b, the processor may generate a respective one of RCCR curves of the target battery based on the recorded CV phase data.

In an example, the processor may calculate a CCR value of the target battery based on the recorded CV phase data over a determined period of time. The method may generate a CCR value of the target battery by summing the plurality of CR values over the determined period of time. The processor may calculate a RCCR value based on a threshold CCR value representing a healthy battery and the summed CCR value of the target battery. For example, the processor may calculate the RCCR value according to Equation 1 described above.

In operation 203b, the processor may detect at least one of aging or shorting condition of the target battery based on the generated RCCR curves.

In an example, the processor may determine whether a RCCR value of the RCCR curve of the target battery is greater than the threshold RCCR value of the healthy battery. The processor may detect (and generate corresponding output condition information) that the target battery is at least one of aging or shorting condition based on the determination that the RCCR value of the target battery is greater than the threshold RCCR value.

For example, the processor may determine whether the RCCR curve has an exponential rise from an origin to a particular time point. The origin may be a time point at which a time t on the RCCR curve is zero. The particular time point may be a determined time point at which the time t on the RCCR curve is a reference time (e.g., one second). The processor may detect (and generate corresponding output condition information) an aging condition of the target battery based on the RCCR curve having an exponential rise. The processor may estimate (and generate corresponding output condition information) an SOH of the target battery based on a determined time point on the RCCR curve at which a slope of the RCCR curve starts to remain constant, based on the detection of the aging condition of the target battery. For example, the processor may estimate the SOH based on an RCCR value at the determined time point on the RCCR curve at which the slope of the RCCR curve starts to remain constant.

In an example, the processor may determine that the target battery is unaged based on all RCCR values on the respective RCCR curve being greater than or equal to zero. The processor may estimate (and generate corresponding output condition information) that the SOH of the target battery is 100% based on the target battery being unaged.

For example, the processor may determine whether the RCCR values of the respective RCCR curve go below a zero value for a predetermined duration. For example, when the RCCR curve has a sudden drop, the RCCR curve may include the RCCR values that go below the zero value for the predetermined duration. The predetermined duration may be a time period from a first determined time point (e.g., a point in time at which the time t is 0 seconds) to a second determined time point (e.g., a point in time at which the time t is 10 seconds). The processor may detect (and generate corresponding output condition information) a shorting condition of the target battery based on the determination that the RCCR values of the respective RCCR curve go below the zero value for the predetermined duration. The processor may estimate (and generate corresponding output condition information) an SOS of the target battery based on a long-term slope value of the respective RCCR curve based on the shorting condition of the target battery being detected. The long-term slope value may be, for example, a slope value (e.g., an average slope value) of the RCCR values while the time t is greater than a threshold time.

In an example, the processor may detect (and generate corresponding output condition information) that the target battery is not shorted (e.g., the target battery is non-shorted) when the long-term slope value of the respective RCCR curve is estimated to be zero. The processor may determine that the SOH of the target battery is 100% (e.g., the target battery is healthy and safe) based on the target battery not being shorted.

Figure 3:
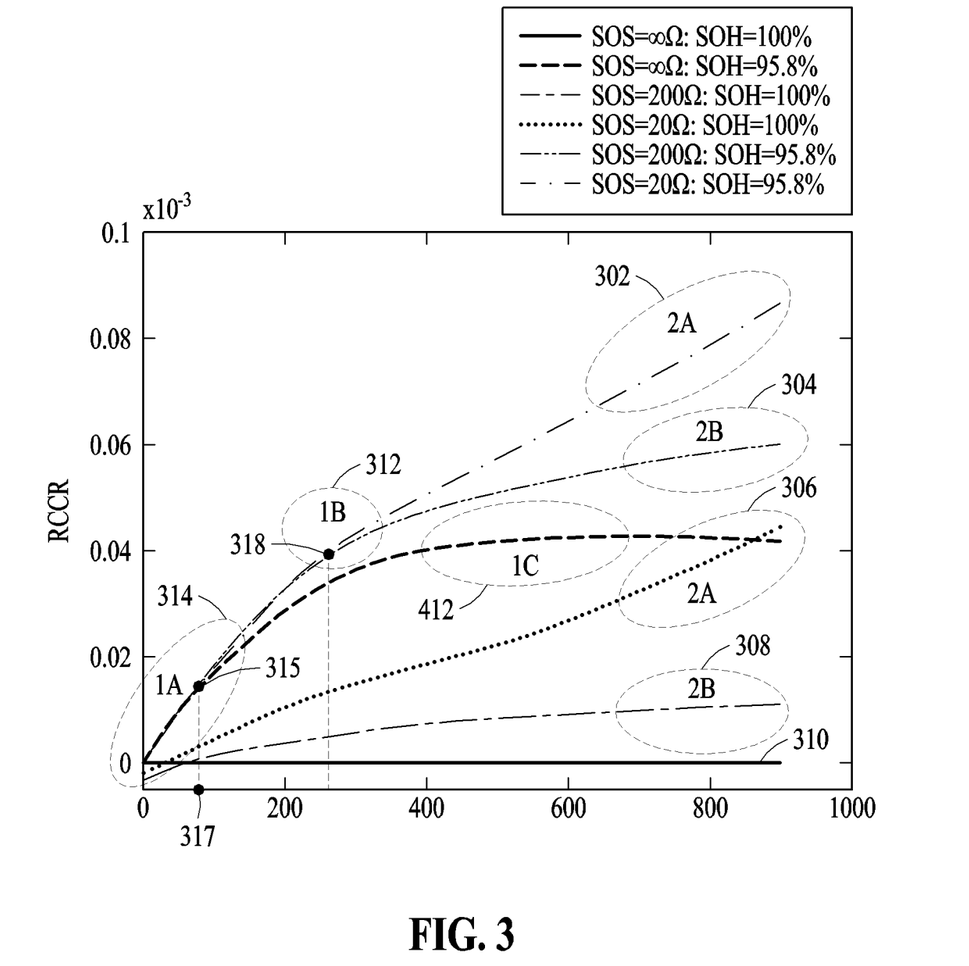
FIG. 3 illustrates an example graph demonstrating an estimation of a state of health (SOH) and a state of short (SOS) with respect to a target battery according to one or more embodiments.

In FIG. 3, when it is detected that a target battery (e.g., the target battery 103 in FIG. 1) is only aging, plural RCCR curves 302, 304, 306, 308, 312, and 314 with respect to a predetermined healthy battery RCCR curve 310 may be analyzed. Each of the plural RCCR curves 302, 304, 306, 308, 312, and 314 may include one or more RCCR values, which may be recorded in operation 202 as a non-limiting example. The one or more RCCR values of a corresponding RCCR curve may be referred to as a set of RCCR values, and may define and depict the corresponding RCCR curve. For an example, as shown in FIG. 3, a set of RCCR values may define and depict a RCCR curve 314. The method may further include determining, based on the analysis of the set of RCCR values of the RCCR curve 314, an exponential rise (e.g., an exponential rise in a region 1A in FIG. 3) in the RCCR curve 314, among the RCCR curves 302, 304, 306, 308, 310, 312, and 314. Specifically, the set of RCCR values of the RCCR curve 314 positively rises for a predetermined duration, and represents a positive value of the target battery. With respect to the exponential rise, the RCCR curve 314 rises exponentially from an origin of the RCCR curve 314 to a particular point on the RCCR curve 314.

For example, in FIG. 3, the region 1A may depict that there is an exponential rise in a set of RCCR values of the RCCR curve 314 when compared with the predetermined RCCR curve 310 of the healthy battery. In the region 1A, the set of the RCCR values of the RCCR curve 314 of the target battery positively rises from a zero point on an axis to a point 315 during an initial time 317 (e.g., a point corresponding to the initial time 317 is before 200 seconds on a graph). Accordingly, the particular point on the RCCR curve 314 may correspond to the point 315. The positive RCCR values in initial times may be indicative of only aging and no shorting. Thus, it may be determined that the point 315 is an aging point.

Figure 4:
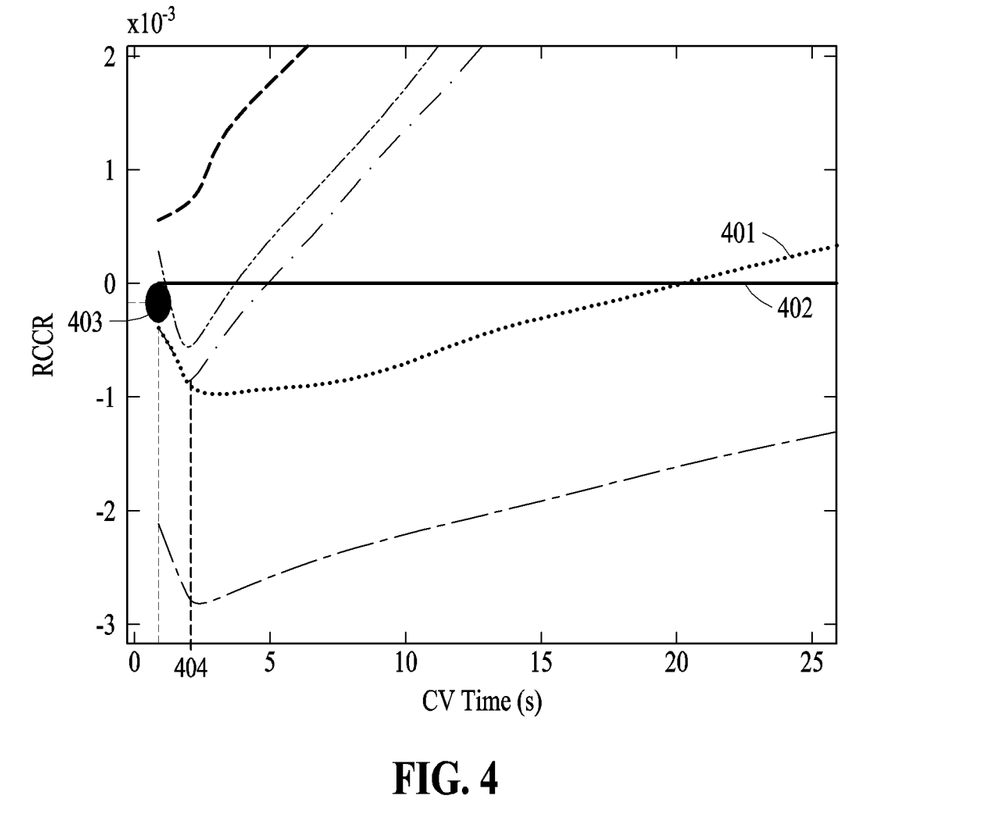
FIG. 4 illustrates an example graph demonstrating a detection of a shorting condition of a target battery according to one or more embodiments.

FIG. 4 illustrates an example shorting condition of a target battery (e.g., the target battery 103 in FIG. 1). In FIG. 4, when it is detected that the target battery is shorting only, the plural RCCR curves may be analyzed with respect to a predetermined healthy battery RCCR curve 402. Each RCCR curve may include one or more RCCR values, which may be referred to as a set of RCCR values and recorded in operation 202 as a non-limiting example. A set of RCCR values of a corresponding RCCR curve may be used to define and depict the corresponding RCCR curve. In an example, as illustrated in FIG. 4, the method may further include determining, based on the analysis of a set of RCCR values of a corresponding RCCR curve 401, a sudden drop in the corresponding RCCR curve 401, in which the set of RCCR values of the corresponding RCCR curve 401 goes below a zero value (negative) for a predetermined duration, wherein the set of RCCR values represents a negative value of the target battery.

For example, in FIG. 4, a shorted battery (e.g., aged or unaged) shows a sudden drop from a point 403 on the RCCR curve 401 at the beginning of a CV phase for a first few seconds 404. The graph demonstrates that RCCR at the beginning of the CV phase goes below zero, that is, the RCCR values on the RCCR curve 401 go negative 403 for the few seconds 404 when compared with the predetermined RCCR curve 402 of the healthy battery.

In FIG. 3, estimation of an SOH of the target battery after detection of the aging condition of the target battery may be analyzed. The method 200 may include analyzing the respective RCCR curves 302, 304, 306, 308, 312, and 314 each including the one or more RCCR values, which may be recorded in operation 202. The method may further include determining a saturated RCCR curve 306 including a set of RCCR values that remains constant for a predetermined time duration based on the analysis of the set of RCCR values, wherein the set of RCCR values is analyzed and determined as a saturated value of the target battery. The method may further include estimating the SOH of the target battery from the saturated RCCR curve 306, wherein a SOH value corresponds to an RCCR value from the set of RCCR values of the RCCR curve 306, wherein the RCCR value corresponds to a saturation point 1C on the saturated RCCR curve 306 from which the set of RCCR values starts to remain constant for the predetermined time duration.

For example, in FIG. 3, the value of the SOH may be estimated based on a value of the saturation point 10 (e.g., no shorting) on the saturated RCCR curve 306 when compared with the predetermined RCCR curve 310. The saturation for an only aged battery may depend on a degradation mechanism. Thus, the value of the saturation point 10 on the saturated RCCR curve 306 may serve as the estimation of the SOH. In this case, as illustrated in FIG. 3, the value of the saturation point 10 may be around 0.042 or 4.2% which matches a cell 2 SOH of 95.5% to 96%.

In FIG. 3, the estimation of an SOS of the target battery after detecting of the shorting condition of the target battery may be analyzed. The method 200 may include analyzing the respective RCCR curves 302, 304, 306, 308, 312, and 314 each including the one or more RCCR values, which may be recorded in operation 202 and referred to as a set of RCCR values for a corresponding one of the respective RCCR curves. The method 200 may further include determining at least one RCCR curve 314 including a set of RCCR values that rises exponentially with respect to an inflation point 1B on the at least one RCCR curve 314 for a predetermined time duration based on the analysis of the set of RCCR values of the RCCR curve 314. The method may further include estimating the long-term slope value of the determined at least one RCCR curve, and the long-term slope value may be proportional to the SOS of the target battery. The slope of the RCCR curve may be plotted for the last 300 seconds on the RCCR curve 304 for example. Wherein, SOS=a*slope, where "a" may be a constant, which is predetermined for a battery type.

In FIG. 3, the estimation of the SOH of the target battery after detecting of aging and shorting conditions of the target battery may be analyzed. The method 200 may include analyzing the respective RCCR curves each including the one or more RCCR values, which may be recorded in operation 202, and referred to as a set of RCCR values for a corresponding one of the respective RCCR curves. The method further may further include determining an inflation RCCR curve 304, including a set of RCCR values that saturates at the inflation point 1B on the inflation RCCR curve 304 for a predetermined time duration, based on the analysis of the set of RCCR values of the RCCR curve 304. For example, the set of RCCR values of the RCCR curve 304 may be an inflation value of the target battery. The method may further include estimating the SOH of the target battery from the inflation RCCR curve 304, wherein the SOH value may correspond to an RCCR value from the set of RCCR values, and wherein the RCCR value may correspond to a saturation point 2B on the inflation RCCR curve 304 from which the set of RCCR values remains saturated for the predetermined time duration.

In FIG. 3, estimation of an SOS of the target battery after detecting of the aging and shorting conditions of the target battery may be analyzed. The method 200 may include determining a long-term slope of the RCCR curve 304, from the respective RCCR curves 302, 304, 306, 308, 312, and 314, in which the set of RCCR values of the RCCR curve 304 starts to increase after the inflation point 1B for a predetermined time duration based on the analysis. The method 200 may further include estimating the SOS of the target battery from the long-term slope RCCR curve 304, wherein the SOS value corresponds to an RCCR value from the set of RCCR values of the RCCR curve 304, wherein the RCCR value may correspond to an increasing point 318 on the long-term slope RCCR curve 304 from which the set of RCCR value starts to increase from the increasing point 318 for the predetermined time duration t, where the time duration t is greater than 300 seconds. The time from where the RCCR value of the RCCR curve 304 starts to increase is 300 seconds.

Figure 5:
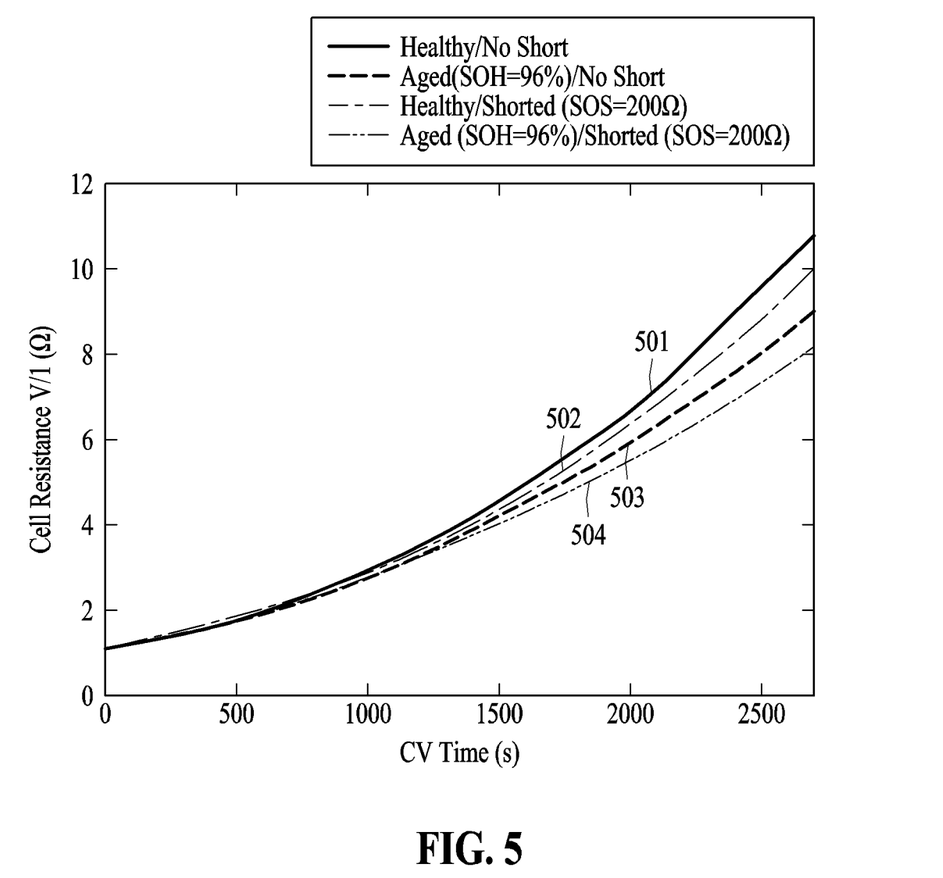
FIG. 5 illustrates an example graph demonstrating experimental data on a target battery for different aging and shorting conditions according to one or more embodiments.

FIG. 5 illustrates an example experimental data demonstrating a target battery detected as being in different aging and shorting conditions according to one or more embodiments.

Referring to FIG. 5, the example experimental data are illustrated in a cell resistance V/I vs. time graph, a y-axis is cell resistance measured in a CV phase over time (e.g., an x-axis). The terms "cell" and "battery" may be used interchangeably. The term "cell" is used in the one or more embodiments only for understanding the cell resistance V/I vs. time graph. For a healthy cell, an SOH and an SOS are determined as being 100%.

When CV phase cell resistance V/I shows a considerable decrease with respect to the healthy battery, it is an indication that the target battery may be in at least one of aging and shorting conditions. When a cumulative value of a CV with respect to time decreases, or in other words, when a cumulative value of CV phase data of the target battery is greater than CV phase data of the healthy battery, it is an indication that the target battery may be in either aging or shorting condition, or in both conditions. The effect on the graph is cumulative and quite significant even at very early stages of aging (e.g., SOH=96%) and shorting (e.g., SOS=2000) conditions with an average difference/decrease of ~33% as compared to the healthy cell (e.g., SOH=100% and SOS=∞Ω) at the end of CV. In the cell resistance V/I vs. time graph, a line 501 may represent an unaged, non-shorted battery. A line 503 may represent an aged (e.g., SOH=96%), non-shorted battery. A line 502 may represent an unaged, shorted (e.g., SOS=2000) battery. A line 504 may represent an aged (e.g., SOH=96%), shorted (e.g., SOS=2000) battery.

Figure 6:
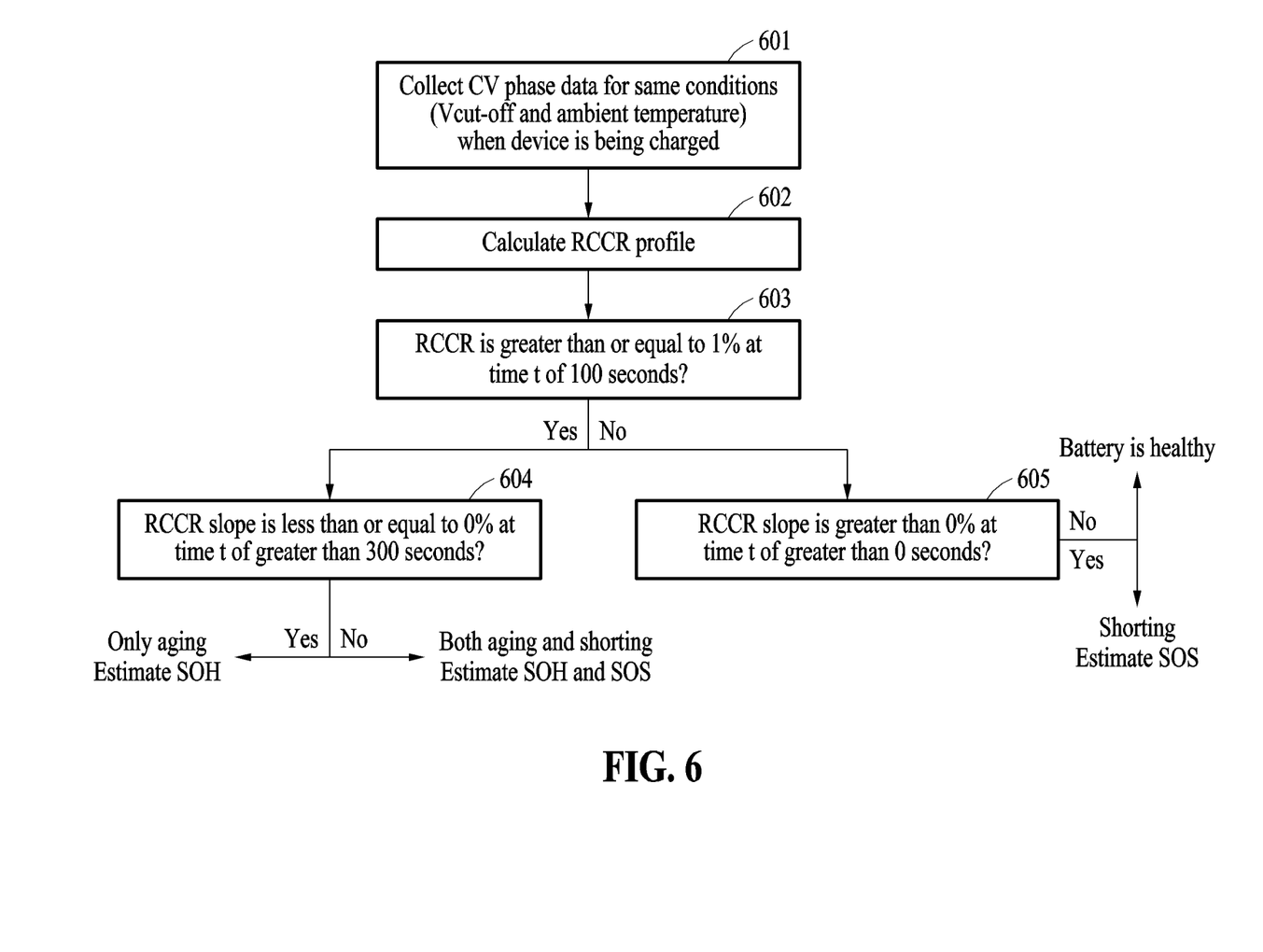
FIG. 6 illustrates an example method of detecting a target battery state using relative cumulative cell resistance (RCCR) based on SOH-SOS estimation according to one or more embodiments.

FIG. 6 illustrates an example method of detecting a target battery using RCCR based on SOH-SOS estimation. An example method 600 as shown in FIG. 6 may be implemented with an electronic device (e.g., the electronic device 100 of FIG. 1). In an implementation, the method 600 may be performed by at least one processor (e.g., the processor 101 of FIG. 1). Referring to FIG. 6, the example method 600 may include operations 601 through 605, which may be performed in the shown order and manner. However, the order of some operations may be changed, some of the operations may be omitted, or any additional operation may be added, without departing from the spirit and scope of the shown example. At least some of the operations of FIG. 6 may be performed in parallel, simultaneously, or any suitable order that may optimize the battery detecting method described herein.

For estimation of the SOH-SOS of a target battery (e.g., the target battery 103 in FIG. 1), in operation 601, when the target battery is being charged, a processor may record CV phase data for the same conditions (e.g., Vcut-off and ambient temperature). Operation 601 may correspond to operation 201 of FIG. 2 as a non-limiting example.

In operation 602, the processor may generate a RCCR profile by calculating an RCCR value of the target battery based on the recorded CV phase data. Operation 602 may correspond to operation 202 of FIG. 2.

In operation 603, the processor may analyze whether the calculated RCCR value of the target battery is greater than 1% at a time of t=100 seconds. The analysis may include comparing the RCCR value of the target battery with a threshold RCCR value representing a healthy battery. Operation 603 may correspond to operation 203 of FIG. 2 as a non-limiting example.

If a comparison result from operation 603 is yes, then the processor performs operation 604, and if the comparison result from operation 603 is no, then the processor performs operation 605. As a non-limiting example, operations 604 and 605 may correspond to operations 204 and 205 of FIG. 2, respectively.

For example, in operation 604, the processor may determine whether an RCCR slope is saturated at a time of t=300 seconds. The slope may be identified/determined from a plurality of RCCR curves of the target battery (e.g., the plural RCCR curves in FIG. 3).

When the RCCR slope is identified as being saturated at 0%, it is determined with an indication that the target battery may be only in an aging condition. Based on this indication, estimation of an SOH from an RCCR saturation value is achieved.

When the RCCR slope is identified as being not saturated at 0% at the time t=300 seconds, it is determined with an indication that the target battery may be in both aged and shorted conditions. Based on this indication, as illustrated in FIG. 3 for example, estimation of the SOH with the RCCR value at the inflation point 1B and the SOS from the RCCR slope for the predetermined time t exceeding 300 seconds is achieved.

In operation 605, the processor may determine whether the RCCR slope is greater than 0% for all times t greater than 0 seconds. As a non-limiting example, operations 604 and 605 may correspond to operations 204 and 205 of FIG. 2, respectively.

When the RCCR slope is identified not greater than 0% for all times t greater than 0 seconds, it is determined with an indication that the target battery is a healthy battery.

When the RCCR slope is identified greater than 0% for all times t greater than 0 seconds, it is determined with an indication that the target battery is shorted. Based on this indication, estimation of the SOS with the RCCR slope may be performed.

Some example technical solutions provided by any of the above one or more embodiments may include the following advantages:
(1) RCCR may be a unique metric for tracking aging and/or shorting;
(2) Even a very soft short of 2000 may be detected with an example accuracy of more than 90%;
(3) The example methods may use only 15 minutes of CV phase data to detect and estimate both SOS and SOH at a same time;
(4) Detection and estimation of SOS-SOH may be achieved within 1 ms. An algorithm size may be less than 1 kilobyte(kB); and
(5) Computational requirements may be minimized.

The processors, memories, electronic devices and apparatuses, and other apparatuses, devices, and components described herein with respect to FIGS. 1-6 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-6 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A processor-implemented method of an electronic device, comprising:
   generating relative cumulative cell resistance (RCCR) curve information of a target battery based on constant voltage (CV) phase data of the target battery recorded during a charging operation of the target battery; and
   generating at least one of aging or shorting condition information of the target battery based on the generated RCCR curve information.

2. The method of claim 1, wherein the generating of the RCCR curve information comprises:
   generating a cumulative cell resistance (CCR) value by calculating a plurality of cell resistance (CR) values of the target battery based on the recorded CV phase data and summing the plurality of CR values over a determined period of time; and
   calculating an RCCR value, of the RCCR curve information, based on a threshold CCR value representing a heathy battery and the CCR value of the target battery.

3. The method of claim 1, wherein the generating of the at least one of the aging or shorting condition information comprises:
   detecting that the target battery is in at least one of an aging or shorting condition based on a determination of whether an RCCR value of the RCCR curve information of the target battery is greater than a threshold RCCR value corresponding to a healthy battery.

4. The method of claim 1, wherein the generating of the at least one of the aging or shorting condition information comprises:
   detecting that the target battery is in an aging condition based on a determination that the RCCR curve information has an exponential rise, in which the RCCR curve information rises, on a corresponding RCCR curve, exponentially from an origin to a particular point.

5. The method of claim 4, further comprising:
   estimating a state of health (SOH) of the target battery based on a point on the RCCR curve at which a slope of the RCCR curve starts to remain constant, based on the aging condition of the target battery being detected.

6. The method of claim 5, wherein the estimating of the SOH of the target battery comprises estimating the SOH based on a RCCR value at the point on the RCCR curve at which the slope of the RCCR curve starts to remain constant.

7. The method of claim 1, wherein the generating of the at least one of the aging or shorting condition information comprises:
   detecting that the target battery is in the shorting condition based on a determination that an RCCR value of the RCCR curve information is negative for a predetermined duration.

8. The method of claim 7, further comprising:
   estimating a state of short (SOS) of the target battery based on a long-term slope value of a RCCR curve of the RCCR curve information, based on the shorting condition of the target battery being detected.

9. The method of claim 1, wherein the generating of the at least one of the aging or the shorting condition information includes detecting whether the target battery is shorted, including determining that the target battery is not shorted in response to a long-term slope value of a RCCR curve, of the RCCR curve information, being estimated to be zero.

10. The method of claim 1,
    wherein the generating of the at least one of the aging or the shorting condition information includes detecting whether the target battery is aged, including determining that the target battery is unaged based on all RCCR values of the RCCR curve information being greater than or equal to zero.

11. An electronic device, comprising:
    a processor configured to:
    generate relative cumulative cell resistance (RCCR) curve information of a target battery based on constant voltage (CV) phase data of the target battery recorded during a charging operation of the target battery; and
    generating at least one of aging or shorting condition information of the target battery based on the generated RCCR curve information.

12. The electronic device of claim 11, wherein the processor is further configured to:
    generate a cumulative cell resistance (CCR) value by calculating a plurality of cell resistance (CR) values of the target battery based on the recorded CV phase data and summing the plurality of CR values over a determined period of time; and
    calculate an RCCR value, of the RCCR curve information, based on a threshold CCR value representing a healthy battery and the CCR value of the target battery.

13. The electronic device of claim 11, wherein the processor is further configured to:

detect that the target battery is in at least one of an aging or shorting condition based on a determination of whether an RCCR value of the RCCR curve information of the target battery is greater than a threshold RCCR value corresponding to a healthy battery.

14. The electronic device of claim 11, wherein the processor is further configured to:
detect that the target battery is in an aging condition based on a determination that the RCCR curve information has an exponential rise, in which the RCCR curve information rise, on a corresponding RCCR curve, exponentially from an origin to a particular point.

15. The electronic device of claim 14, wherein the processor is further configured to estimate a state of health (SOH) of the target battery based on a point on the RCCR curve at which a slope of the RCCR curve starts to remain constant, based on the aging condition of the target battery being detected.

16. The electronic device of claim 15, wherein the processor is further configured to:
estimate the SOH based on a RCCR value at the point on the RCCR curve at which the slope of the RCCR curve starts to remain constant.

17. The electronic device of claim 11, wherein the processor is further configured to:
detect that the target battery is in the shorting condition based on a determination that an RCCR value of the RCCR curve information is negative for a predetermined duration.

18. The electronic device of claim 17, wherein the processor is further configured to:
estimate a state of short (SOS) of the target battery based on a long-term slope value of a RCCR curve of the RCCR curve information, based on the shorting condition of the target battery being detected.

19. The electronic device of claim 11, wherein the processor is further configured to:
determine that the target battery is not shorted in response to a long-term slope value of a RCCR curve, of the RCCR curve information, being estimated to be zero.

20. The electronic device of claim 11, wherein the processor is further configured to:
determine that the target battery is unaged based on all RCCR values of the RCCR curve information being greater than or equal to zero.

21. The electronic device of claim 11, wherein the processor is further configured to:
output the generated at least one of the aging or shorting condition information for controlling operation of the electronic device.

* * * * *